United States Patent
Tamagaki et al.

[11] Patent Number: 5,744,017
[45] Date of Patent: Apr. 28, 1998

[54] VACUUM ARC DEPOSITION APPARATUS

[75] Inventors: Hiroshi Tamagaki; Hiroshi Kawaguchi; Hirofumi Fujii; Katsuhiko Shimojima; Takeshi Suzuki; Koji Hanaguri, all of Takasago, Japan

[73] Assignee: Kabushiki Kaisha Kobe Seiko Sho, Kobe, Japan

[21] Appl. No.: 357,752

[22] Filed: Dec. 16, 1994

[30] Foreign Application Priority Data

Dec. 17, 1993 [JP] Japan .................. 5-318603
Dec. 20, 1993 [JP] Japan .................. 5-320379
Dec. 21, 1993 [JP] Japan .................. 5-322763

[51] Int. Cl.[6] .................................. C23C 14/22
[52] U.S. Cl. .................. 204/298.41; 204/192.38
[58] Field of Search .............. 204/192.38, 298.41, 204/298.11, 298.21

[56] References Cited

U.S. PATENT DOCUMENTS

| | | | |
|---|---|---|---|
| 3,793,179 | 2/1974 | Sablev et al. | 204/298.41 |
| 4,430,184 | 2/1984 | Mularie | 204/298.41 X |
| 4,563,262 | 1/1986 | Sablev et al. | 204/298.41 |
| 4,600,489 | 7/1986 | Lefkow | 204/298.41 X |
| 5,026,466 | 6/1991 | Wesemeyer et al. | 204/298.41 X |
| 5,037,522 | 8/1991 | Vergason | 204/298.41 |
| 5,200,049 | 4/1993 | Stevenson et al. | 204/298.22 |
| 5,269,898 | 12/1993 | Welty | 204/298.41 |
| 5,298,136 | 3/1994 | Ramalingam | 204/298.41 X |
| 5,380,421 | 1/1995 | Gorokhovsky | 204/298.41 |
| 5,527,439 | 6/1996 | Sieck et al. | 204/298.22 X |

FOREIGN PATENT DOCUMENTS

| | | |
|---|---|---|
| 40 38 497 | 2/1992 | Germany . |
| 40 42 286 | 2/1992 | Germany . |
| 711787 | 6/1978 | Russian Federation .......... 204/298.41 |
| 2 153 853 | 9/1985 | United Kingdom . |

Primary Examiner—Nam Nguyen
Attorney, Agent, or Firm—Oblon, Spivak, McClelland, Maier & Neustadt, P.C.

[57] ABSTRACT

A vacuum arc deposition apparatus includes arc power sources having cathodes connected to both ends of an evaporation source; exciting coils disposed at positions axially outwardly far from both the ends of the evaporation source so as to be coaxial with the evaporation source; and coil power sources independently connected to the exciting coils. In this apparatus, each of the coil power sources is capable of controlling the exciting current in such a manner that the film thickness and the consumption of the evaporation source are suitably distributed. Moreover, an arc containment device of the vacuum arc deposition apparatus includes an arc containment body having a diameter substantially the same as that of a cylindrical evaporation source, which is disposed at one end portion of the evaporation source.

12 Claims, 19 Drawing Sheets

F I G. 3
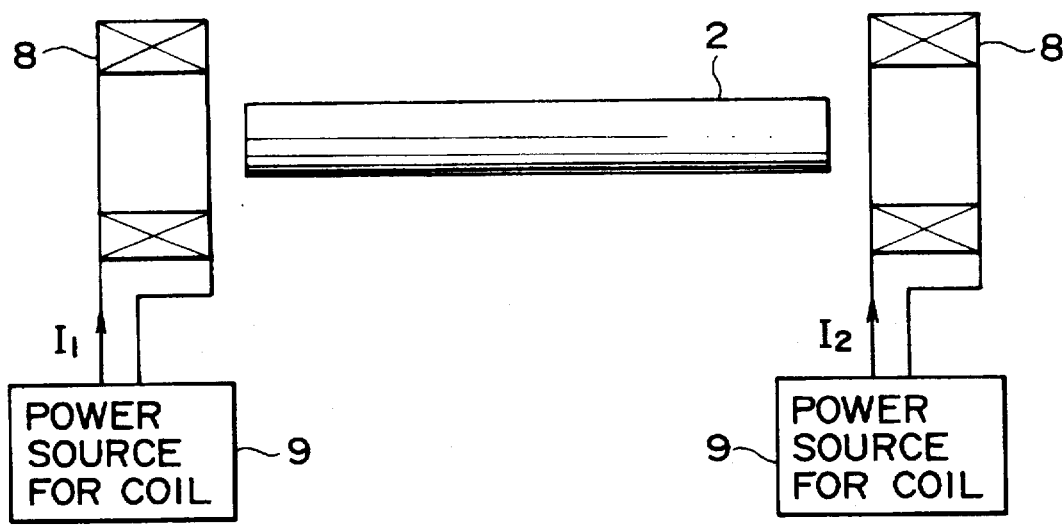
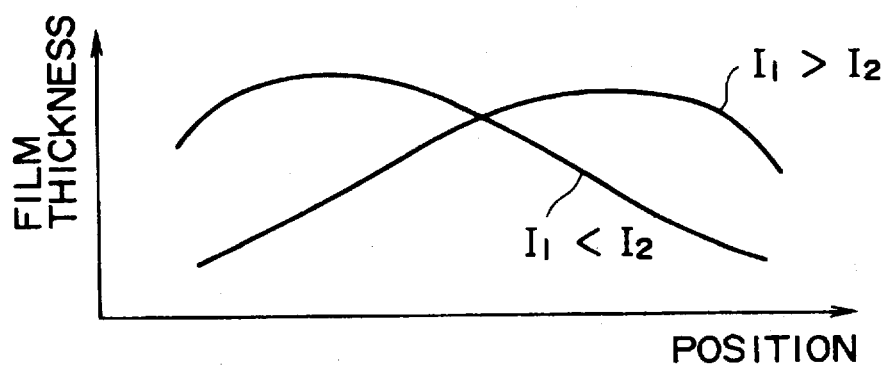

——— DISTRIBUTION OBTAINED BY FILM FORMATION FOR EACH 100min USING CURRENT IN ③ AND ④

------ DISTRIBUTION OBTAINED BY FILM FORMATION FOR 60min USING CURRENT IN ③ OR FOR 40min USING CURRENT IN ④

—·—·— DISTRIBUTION OBTAINED BY FILM FORMATION FOR 60min USING CURRENT IN ③ AND FOR 40min USING CURRENT IN ④

COMBINATION OF CURRENTS IN
①, ②, ④ AND ⑤

VACUUM ARC DEPOSITION APPARATUS

BACKGROUND OF THE INVENTION

1. Field of the Invention

The present invention relates to a vacuum arc deposition apparatus for forming a film on a workpiece using vacuum arc discharge.

2. Description of the Related Art

Of methods of forming films in vacuum, a vacuum arc deposition method capable of effectively forming a film has been widely used in industrial applications. The vacuum arc deposition method includes the steps of generating the so-called vacuum cathode arc discharge between a cathode and an anode disposed in a vacuum vessel, evaporating the material of the cathode from arc spots generated on the surface of the solid cathode, and depositing the vapor of the evaporated material on a substrate disposed in the vacuum vessel thereby forming a film. Apparatuses for carrying out the vacuum arc deposition method have been known, for example in Unexamined Japanese Patent Publication No. HEI 5-106025.

The above-described prior art method is characterized by providing an axial magnetic field formed on the surface of the evaporation source (this is formed by a spiral coil disposed around the rod-like evaporation source) and a circumferential magnetic field formed at least partially on the surface of the evaporation source (this is excited by an arc current flowing in the rod-like evaporation source), wherein the velocity and the direction of arc spots are controlled by the combination of these two magnetic fields.

Of various examples disclosed in the above-described document, there is shown the example of supplying arc currents from both ends of the arc evaporation source. This example is intended to perform a substantially continuous discharge from the rod-like evaporation source. According to this document, it becomes possible to continuously realize uniform discharge in the axial direction by reciprocating arc spots along the axial direction of the evaporation source using the balanced currents supplied from both the ends of the evaporation source.

In the above document, there is further disclosed a technique of providing sensors for detecting arc spots at both the ends of the evaporation source (target), thereby exactly controlling the reciprocating movement of arc spots on the basis of signals from the sensors, resulting in the uniform consumption of the target.

The prior art technique of providing the sensors, however, has arisen a problem in that the control of arc spots by signals from the sensors is complicated and requires an expensive controller with a complex structure.

Notwithstanding such a complex controller, it has been difficult to prevent the localization of arc spots at the end portions of the target because of an increase in arc discharge current and of extension in the target length.

As for the control of arc spots by adjustment in the cathode current balance, it is effective for the case that the total current is small; however, in the case where the total current is increased, the scanning of arc spots is difficult or the scanning direction of arc spots is reversed even by increasing the difference in currents at both the ends, thus largely deteriorating the controllability.

Additionally, in the apparatus having an arc containment ring ("insulator 12" in the above-described document) provided at each end portion of the cylindrical evaporation source for preventing the escape of arc spots from the specified evaporating surface of the cylindrical evaporation source, there occurs the following problem. Namely, the arc containment ring has an outside diameter sufficiently larger than that of the cylindrical evaporation source and is coaxially inserted around the end portion of the cylindrical source, so that when the arc discharge is continued for a long time on the surface of the cylindrical evaporation source, the vapor of the evaporated material is deposited on the surface of the arc containment ring projecting outwardly from the evaporating surface, and the deposited material on the surface of the ring is short-circuited with the evaporation source, thereby making insufficient the arc containment function.

SUMMARY OF THE INVENTION

An object of the present invention is to provide a vacuum arc deposition apparatus capable of preventing the shifting of arc spots to the end portions of an evaporation source without any complex control, thereby realizing the uniform film thickness distribution and preventing local consumption of the evaporation source.

Another object of the present invention is to provide a vacuum arc deposition apparatus capable of controlling the behavior of arc spots even in the case of a large current discharge.

A further object of the present invention is to provide a vacuum arc deposition apparatus having an arc containment device capable of preventing the deposition of the vapor of an evaporated material.

To achieve the above objects, according to a first aspect of the present invention, there is provided a vacuum arc deposition apparatus in which a cathode of an arc power source is connected to an end portion of a cylindrical evaporation source, comprising:

magnetic field forming means provided at a position axially outwardly far from the end portion of the evaporation source in such a manner as to be coaxial with the evaporation source.

With this construction, it becomes possible to prevent the localization of arc spots to the end portions of the evaporation source, and hence to suppress the local consumption of the target liable to be generated at the end portions.

Specifically, as shown in FIG. 8, when magnetic field forming means 8 is disposed at a position axially outwardly far from the end portion of an evaporation source 2 in such a manner as to be coaxial with the evaporation source 2, a magnetic field is formed near the end portion of the cylindrical evaporation source 2.

The lines of magnetic force formed by the magnetic field forming means 8 are largely focussed in the interior of the magnetic field forming means 8 and are diverged at positions separated from the means 8. Accordingly, the lines of the magnetic force show the configuration passing through the evaporation surface outwardly from the inner side in the direction from the end portion to the center portion of the evaporation source 2.

As shown in FIG. 9, when the evaporating surface of the evaporation source 2 intersects the lines of the magnetic force, the vacuum arc spot receives a first force in the circumferential direction of the evaporating surface due to the interaction between the lines of magnetic force and arc current, and a second force in the direction where the intersecting angle between the evaporation source 2 and the lines of magnetic force becomes acute. The first force only gives the turning motion on the target to arc spots; but the second force exhibits a function of shifting arc spots from the end portion to the center portion of the evaporating surface of the evaporation source 2.

As described above, in the case where a cylindrical evaporation source is continuously discharged using a large current, arc spots tend to be shifted to the end portion of the evaporation source; however, as shown in the present invention, the use of the above second force can cancel the shift of arc spots, and can eliminate the target consumption shifted to the end portion and uneven film thickness distribution.

In the above apparatus, the magnetic field forming means may be composed of an exciting coil, and a coil power source, which is provided for supplying an exciting current to the exciting coil, is preferably capable of controlling the exciting current in such a manner that the film thickness and the consumption of the evaporation source are suitably distributed. With this construction, since the exciting current to the exciting coil can be controlled, it becomes possible to suitably control the intensity of the magnetic field and hence to realize the uniform consumption of the target and the uniform film thickness distribution.

The magnetic field forming means may be axially movable. With this construction, it becomes possible to suitably control the intensity of the magnetic field applied to the evaporation source, and hence to realize the uniform consumption of the target and the uniform film thickness distribution.

A plurality of the magnetic field forming means may be provided, each of which is capable of controlling the intensity of the formed magnetic field. With this construction, it becomes possible to suitably control the intensity of the magnetic field applied to the evaporation source, and hence to realize the uniform consumption of the target and the uniform film thickness distribution.

According to a second aspect of the present invention, there is provided a vacuum arc deposition apparatus comprising:

arc power sources, cathodes of which are connected to both ends of an evaporation source;

exciting coils disposed at positions axially outwardly far from both the ends of the evaporation source in such a manner as to be coaxial with the evaporation source; and coil power sources independently connected to the exciting coils;

wherein each of the coil power sources is capable of controlling the exciting current in such a manner that the film thickness and the consumption of the evaporation source are suitably distributed.

With this construction, since the exciting coils are each disposed at both the ends of the evaporation source, arc spots are shifted from both the ends to the inner side of the evaporation source, thus preventing the localized target consumption and the uneven film thickness distribution at both the ends.

The arc power source may share the coil power source. With this construction, the structure of the apparatus can be extremely simplified.

According to a third aspect of the present invention, there is provided a vacuum arc deposition apparatus comprising:

an evaporation source taken as a cathode;

anode electrodes disposed at least in the vicinity of both the ends of the evaporation source; and an arc power source apparatus capable of independently the currents supplied to the anode electrodes.

With this construction, the control of arc spot scanning is made easy by controlling the anode current balance exerting a large effect on the arc spot scanning.

The cathodes of the arc power source apparatus may be connected to both the ends of the evaporation source, and the arc power source apparatus may be capable of independently controlling the currents supplied to both the ends of the evaporation source.

With this construction, since the balances of the anode current and cathode current can be simultaneously controlled, the arc spot scanning can be easily controlled irrespective of the magnitude of the discharge current.

In the vacuum arc deposition apparatus, most of vapor generated from the evaporation source tends to be moved to the surface of the evaporation source in the vertical direction (radially outwardly). Accordingly, with the construction in which the arc containment body having a diameter substantially the same as that of the evaporation source is disposed at the end portion of the bar-like evaporation source so as to be coaxial with the evaporation source while keeping the electric insulating state therebetween, the vapor is difficult to be deposited around the outer peripheral surface of the arc containment body because the arc containment body does not extend radially outwardly from the evaporation source (the vapor evaporated from the evaporation source is difficult to be moved in the direction of the arc containment body). This is effective to prevent the short-circuit between the arc containment body and the evaporation source, and to prevent the deterioration of the arc containment function.

The arc containment body is preferably formed in a uniform shape along the circumferential direction.

When the arc containment body is made of metal, a specified gap is preferably formed between the end surface of the evaporation source and the arc containment body for keeping an insulating state therebetween.

When the arc containment body is made of an insulator, it is preferably disposed to be closely contacted with the end surface of the evaporation source.

Preferably, an electrode is connected to an end portion of the bar-like evaporation source, and the arc containment body is provided around the outer peripheral surface of the electrode while keeping an electric insulating state therebetween.

A specified gap is preferably formed between the outer peripheral surface of the evaporation source and the cover. With this construction, even when vapor is deposited on the cover, there is a difficulty in generating the short-circuit between the evaporation source and the cover, thus preventing the deterioration of the arc containment function.

Specifically, since the gap between the evaporation source and the cover is prevented from being blocked with foreign matters such as dust, the arc containment function is prevented from being deteriorated, thus eliminating the fear of generation of the short-circuit upon reduction of the diameter of the evaporation source due to the consumption.

The radial gap between the outer peripheral surface of the evaporation source and the cover is preferably specified to be in the range of from 1 to 10 mm.

The cover is preferably disposed to satisfy a relationship of $D<L<3D$, where D is a distance between the outer peripheral surface of the evaporation source and the cover, and L is an axial overlapping distance therebetween.

Preferably, the cover is formed in a ring-shape, and the thickness of the cover is in the range of from 1 to 3 mm.

Preferably, the cover is formed into a ring-shape, and the outer peripheral surface of the cover at the side end portion of the evaporation source is formed into a tapering-down surface.

An electrode may be connected to an end portion of the bar-like evaporation source, and the cover is preferably provided around the outer peripheral surface of the electrode while keeping an electric insulating state therebetween.

According to a preferred arrangement of the present invention, there is provided an arc containment device of a vacuum arc deposition apparatus, wherein an arc containment body having a diameter substantially the same as that of said evaporation source is disposed at the end portion of a bar-like evaporation source so as to be coaxial with said evaporation source while keeping an electric insulating state therebetween, and a cover is provided for covering the boundary portion between said arc containment body and said evaporation source while radially keeping a specified gap therebetween.

In the above device, preferably, an electrode is connected to the end portion of said bar-like evaporation source and said arc containment body is disposed around the outer peripheral portion of said electrode in an electric insulating manner; and said cover is formed in a ring-shape and is supported by said arc containment body.

According to a further preferred arrangement, there is provided an arc containment device of a vacuum arc deposition apparatus comprising a cover which is provided for covering the outer peripheral surface of a lower end portion of a bar-like evaporation source with the vertical axis while radially keeping a specified gap therebetween, and a discharge portion for dropping foreign matters passing through said gap is provided in said cover.

With this construction, since foreign matters such as dust are easily discharged, it becomes possible to prevent the short-circuit between the evaporation source and the cover due to the dust filled in a gap therebetween.

In addition, the wording "bar-like" of the bar-like evaporation source means not only a solid body but also a hollow body. Moreover, in the bar-like evaporation source, the outer surface shape contains an ellipse shape, polygonal shape and the like, other than the circular shape; and further the axis contains not only a linear shape but also a curving shape.

BRIEF DESCRIPTION OF THE DRAWINGS

FIG. 3 is a graph for explaining the function of the first embodiment;

DETAILED DESCRIPTION OF THE PREFERRED EMBODIMENTS

Hereinafter, embodiments of the present invention will be described with reference to the drawings.

[Embodiment 1]

Figure 1:
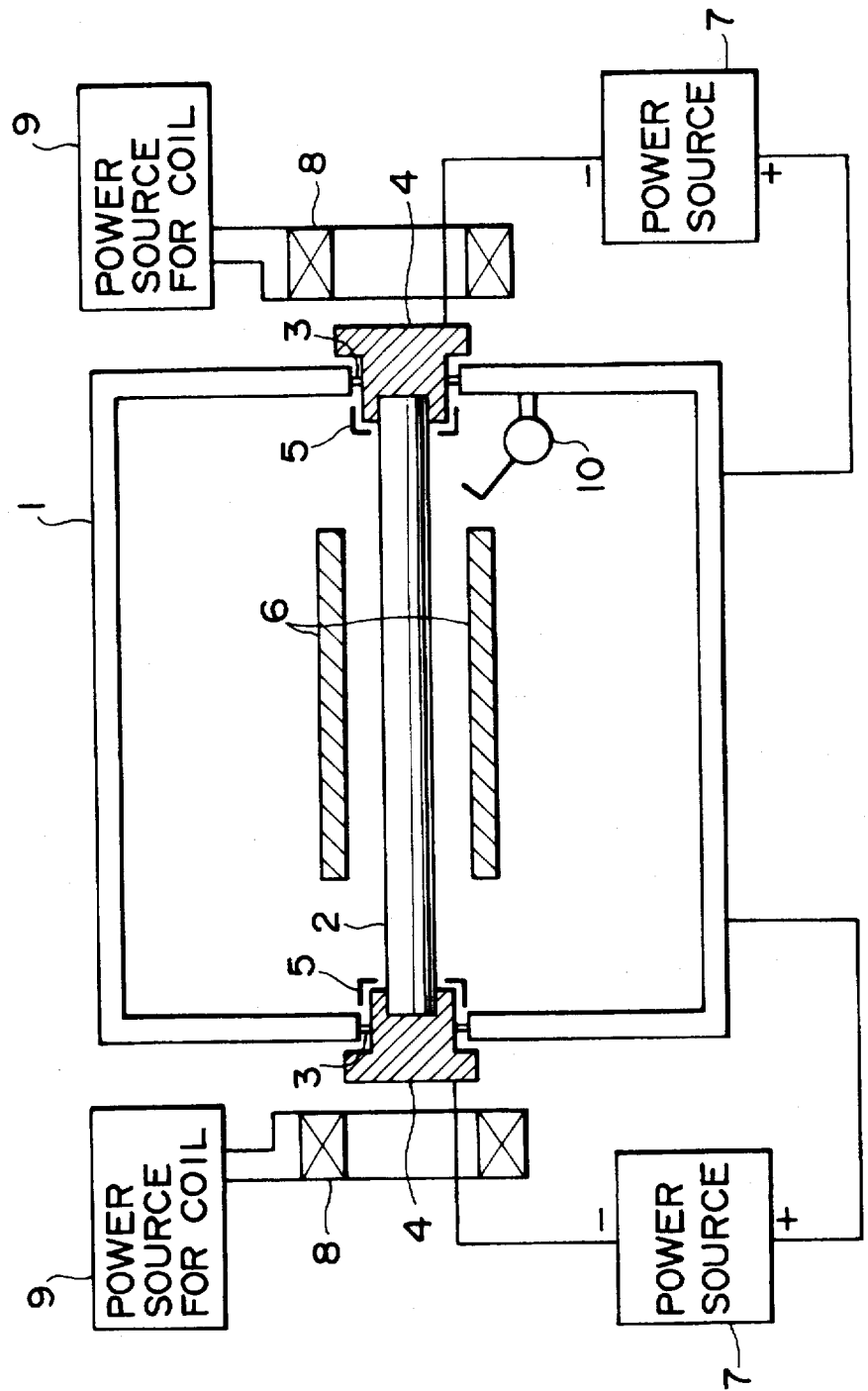
FIG. 1 is a schematic view showing the construction of a first embodiment of the present invention.

FIG. 1 is a schematic view showing the whole construction of a vacuum arc deposition apparatus, wherein a cylindrical deposition source 2 is disposed in a vacuum vessel 1. Both the ends of the evaporation source 2 are each electrically connected to and held by holders 4. The holders 4 are supported in the right and left side walls of the vacuum vessel 1 by way of insulators 3. An arc containment ring 5 for covering the boundary portion between each holder 4 and the evaporation source 2 is provided around the outer peripheral area of the holder 4. A substrate 6 as a workpiece is disposed to surround the evaporation source 2. With respect to the evaporation source 2, at least the outermost peripheral portion thereof is made of a material to be evaporated and to form a film on the substrate 6. The evaporation source 2 is called a target.

Cathodes of arc power sources 7 are respectively connected to the right and left holders. Anodes of the arc power sources 7 are connected to the vacuum vessel 1. In this embodiment, the vacuum vessel 1 itself is taken as an anode; however, an independent anode electrode may be disposed in the vacuum vessel 1, as needed. A pair of the right and left arc power sources 7 corresponding to the right and left holders 4 are provided.

Magnetic field forming means 8 are each provided at positions axially outwardly far from both the ends of the evaporation source 2. The magnetic field forming means 8 are composed of cylindrical exciting coils. The exciting coils 8 are disposed to be coaxial with the evaporation source 2.

In this embodiment, the exciting coils 8 are disposed outside the vacuum vessel 1. The exciting coils are independently connected to coil power sources 9. The coil power source 9 is capable of controlling the exciting current applied to each exciting coil 8.

A striker 10 of an ignition device is provided on the inner surface of the vacuum vessel 1. The vacuum vessel 1 can be kept at a specified pressure by an exhaust device (not shown).

To form a film on the substrate 6 by the vacuum arc deposition apparatus, the interior of the vacuum vessel 1 is kept at a vacuum state with a specified pressure by evacuation using the exhaust device (not shown), and vacuum arc discharge is generated from the evaporation source 2 by the striker 10. With this vacuum arc discharge, arc spots where arc current is concentrated appear on the surface of the evaporation source 2, which evaporate the evaporation source material (target material).

The vapor of the evaporated target material is moved toward the substrate 6 disposed in the vacuum vessel 1, to form a film on the substrate 6. The substrate 6 may be applied with a negative voltage (bias voltage) by a power source (not shown) as needed, and in this case, the film formation is performed while ions in the vapor are accelerated.

A reactive gas such as nitrogen may be introduced in the vacuum vessel 1 as needed for forming a film of a compound with the target material.

In the film formation, the arc spot generated on the surface of the evaporation source 2 is reciprocated from the one axial end to the other axial end of the evaporation source 2, to control the target material to be uniformly evaporated from the surface of the evaporation source 2.

This control of evaporation will be described below.

In this embodiment, there is used the evaporation source 2 having the length of 800 mm and the diameter of 90 mm; and the exciting coil 8 having a diameter of 315 mm at the center position of the winding is disposed at the position separated from the evaporation source 2 by 200 mm.

Prior to the description of the control of evaporation in this embodiment, a comparative example in which no current is applied to the exciting coil 8 will be described.

The comparative example was performed as follows: namely, in the state that no current was applied to the exciting coils 8, vacuum arc discharge was generated by supplying a total current of 1000 A (each current: 500 A) from both the ends of the evaporation source 2 by the arc power sources 7. As a result, it was visually observed that arc spots were liable to be shifted to the end portions of the evaporation source 2. In such a state, the discharge was performed for 4 hr in total. Consequently, both the ends of the evaporation source 2 were consumed by evaporation and constricted in a level visible to the naked eye; and as shown by the film thickness distribution in the curve (a) of FIG. 2, the film formation rate was particularly high at both the ends of the substrate 6.

On the other hand, according to this embodiment, the same discharge as in the above comparative example was generated from the surface of the evaporation source 2 in the state that the exciting coils 8 at both the ends of the evaporation source 2 were each excited at 5000 AT by the coil power sources 9. As a result, it was visually observed that arc spots were collected at the central portion of the evaporation source 2.

The arc spots near the end portion of the evaporation source 2 were turned in a spiral shape by the effect of the axial component of the magnetic field generated by the exciting coil 8. On the contrary, the arc spots at the center portion of the evaporation source 2 were moved in a random fashion by no effect of the magnetic field generated by the exciting coil 8. As for the exciting directions of the coils 8 at both the ends of the evaporation source 2, the function of shifting arc spots to the center portion of the evaporation source 2 is not changed in either case that the exciting directions are the same or reversed to each other, which shows that either polarity is usable. Even by the discharge for about 20 hr in such a state, the consumption of the end portions of the evaporation source 2 was not observed so much.

Figure 2:
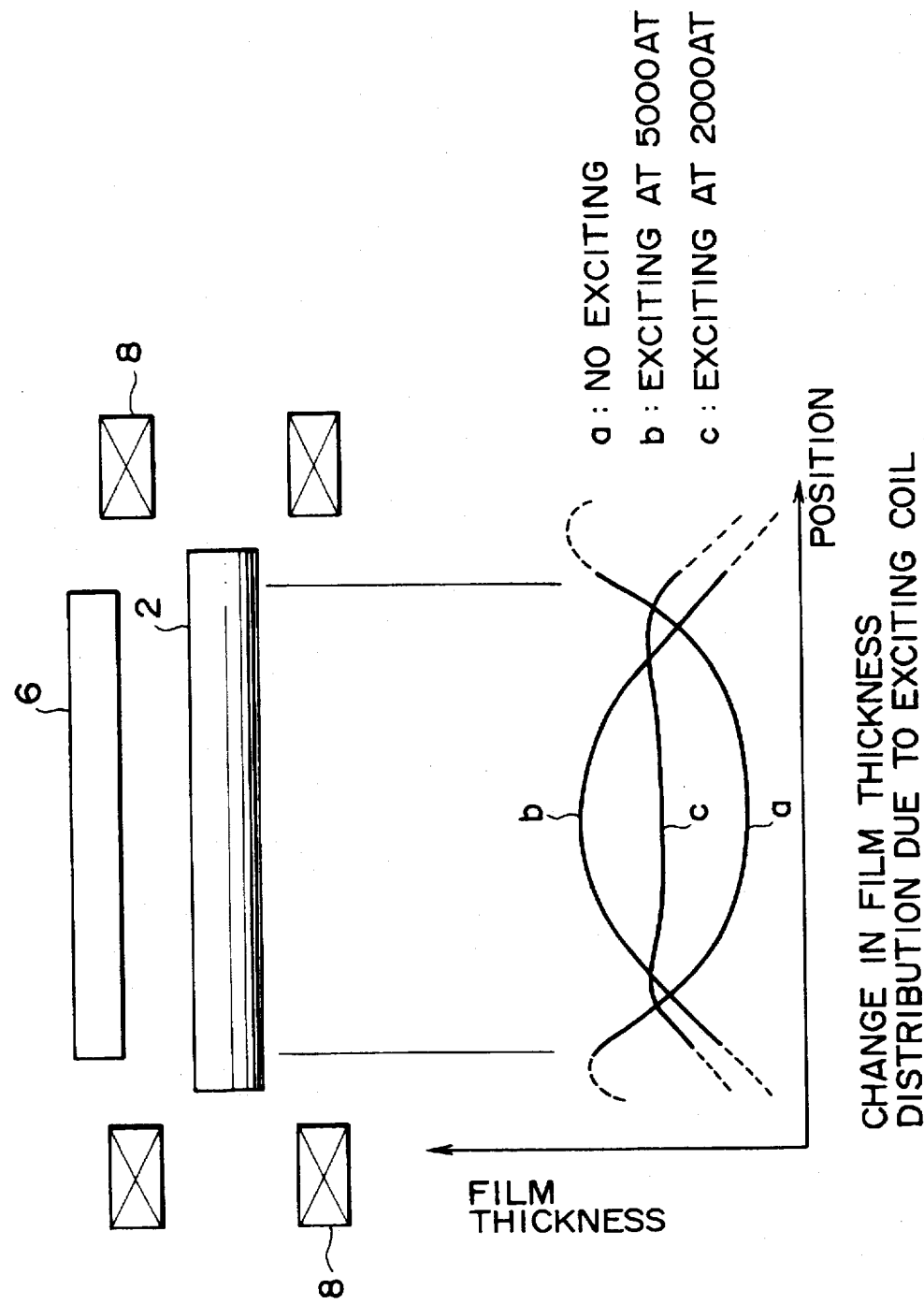
FIG. 2 is a graph for explaining the function of the first embodiment.

In such a state, the film formation test on the substrate 6 was carried out in the same manner as in the comparative example, which gave the film formation distribution shown by the curve (b) of FIG. 2. As is apparent from this film thickness distribution, the film formation rate near the center portion of the evaporation source 2 is increased.

The same film formation test was performed except that the exciting current of the exciting coil 8 was set at 2000 AT, which gave the film formation distribution shown by the curve (c) of FIG. 2. As is apparent from this film formation distribution, the film formation rate is nearly uniform substantially over the whole length of the evaporation source 2. This shows that the uniform film thickness distribution can be easily obtained by suitably adjusting the current of the exciting coil 8.

As described above, according to this embodiment, it becomes possible to solve the prior art problem of shifting arc spots to both the ends of the long cylindrical evaporation source upon a large current discharge and hence to suppress the consumption of the end portions of the evaporation source, which leads to the good film thickness distribution in the axial direction of the target.

In addition to the uniform film thickness distribution, there can be adjusted the film thickness distribution by the control of currents of the exciting coils 8 at both the ends of the evaporation source 2.

For example, by increasing the coil current I1 of one exciting coil 8 more than the coil current I2 of the other exciting coil 8, arc spots can be shifted to the side where the exciting current is small, thus adjusting the film thickness distribution.

Figure 4A:
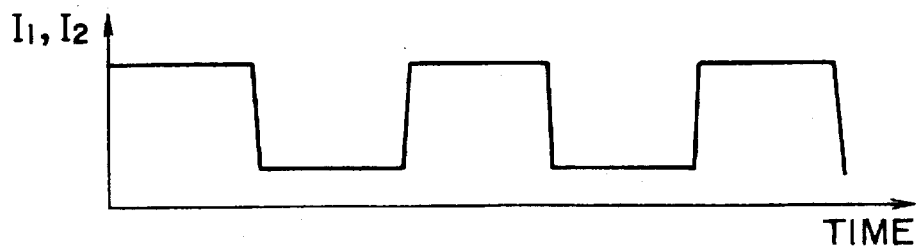
FIG. 4 is a graph for explaining the function of the first embodiment.
Figure 4B:
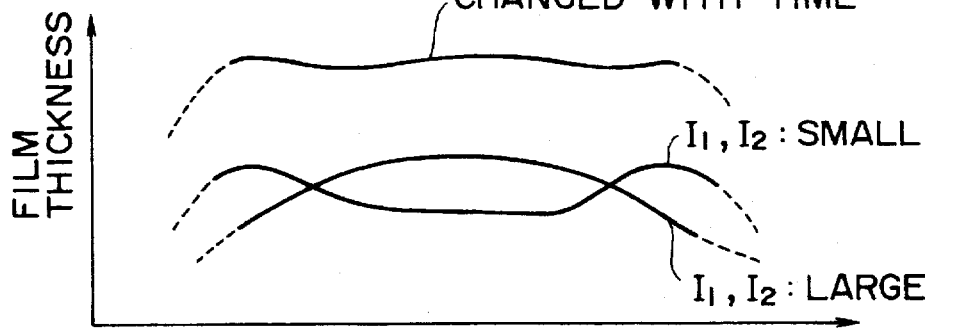

A further uniform film thickness distribution can be obtained by changing the current $I_1$, and $I_2$ of the exciting coils with time, as shown in FIG. 4. For example, the film thickness distribution shifted to the center portion and the distribution shifted to the end portion are alternately generated by periodically repeating the magnitude of the supply current to the exciting coil 8, and by composition of these two film thickness distribution, the uniform film thickness distribution and the uniform target consumption can be realized.

Figure 5:
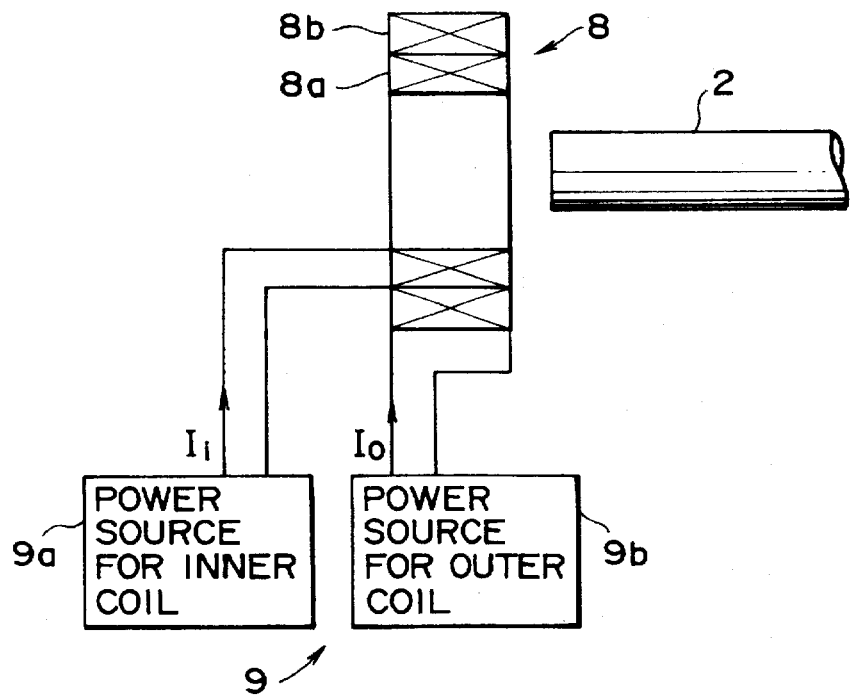
FIG. 5 is a schematic view showing the construction of a modification of the first embodiment of the present invention.

FIG. 5 shows a modification of the first embodiment of the present invention, wherein each of the exciting coils at both the ends of the evaporation source 2 is divided into a plurality of parts for selectively using each coil 8.

Specifically, the exciting coil 8 is divided into an inner coil 8a and outer coil 8b disposed to be coaxial with each other. The inner and outer coils 8a and 8b are respectively connected to the power sources 9a and 9b such that the supply currents thereto can be independently controlled.

The diameter of the exciting coil 8 and the distance between the exciting coil 8 and the end portion of the evaporation source 2 exert an effect on the configuration of the magnetic field generated by the coil 8, which in turn exerts an effect on arc spots.

For example, when the diameter of the exciting coil 8 is small, the effect exerted on the position separated from the coil 8 is significantly reduced, that is, the effect of the magnetic field generated by the coil 8 is limited to the vicinity of the coil 8. Accordingly, in the case where the function of the coil 8 is limited to the prevention of the local consumption of the end portion of the evaporation source 2, the diameter of the coil 8 may be set to be smaller. On the contrary, in the case where the effect of the magnetic field is desirable to be exerted even to arc spots far from the end portion of the evaporation source 2, the coil 8a having a small diameter and the coil 8b having a large diameter are combined, and by the combination of the exciting currents, the effect exerted on the arc spots can be controlled.

Figure 6:
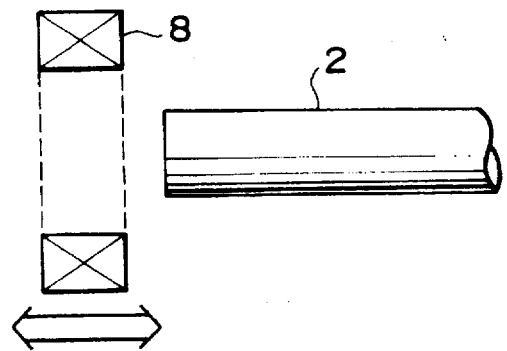
FIG. 6 is a schematic view showing the construction of another modification of the first embodiment of the present invention.

FIG. 6 shows another modification of the first embodiment of the present invention, wherein the position of the exciting coil 8 is variable. Specifically, the exciting coil 8 is provided to be movable in the axial direction, so that the intensity of the magnetic field generated by the coil 8 against the evaporation source 2 can be adjusted by controlling the position of the coil 8 using a moving device (not shown).

With this construction, the degree of the function applied to arc spots becomes variable.

Figure 7:
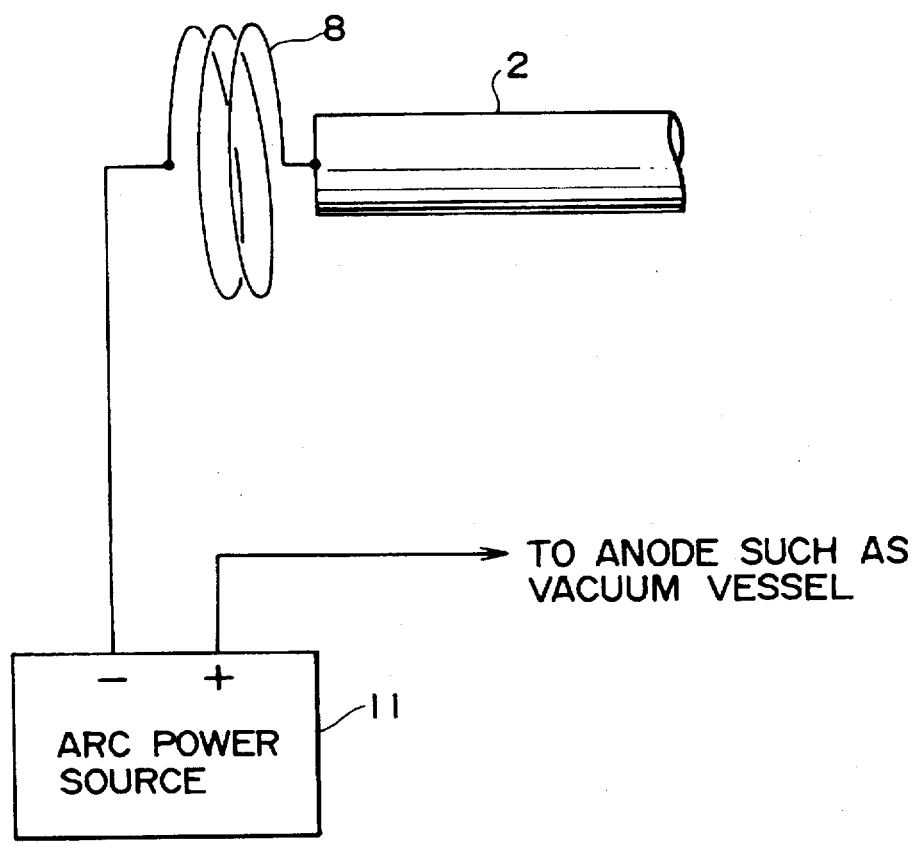
FIG. 7 is a schematic view showing the construction of a further modification of the first embodiment of the present invention.
Figure 8:
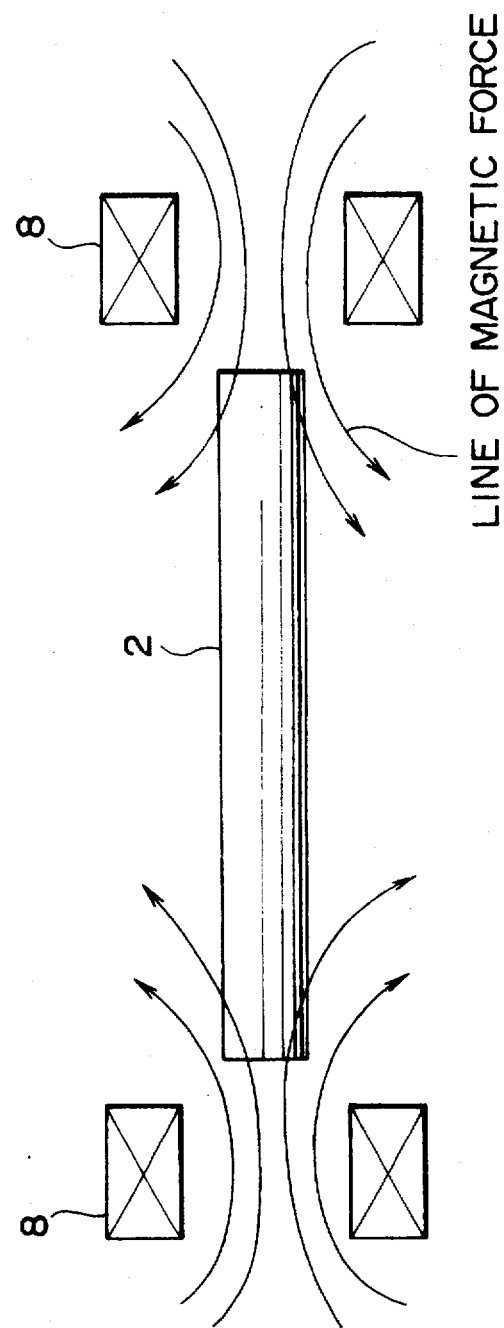
FIG. 8 is a schematic view for explaining the function of the present invention.
Figure 9:
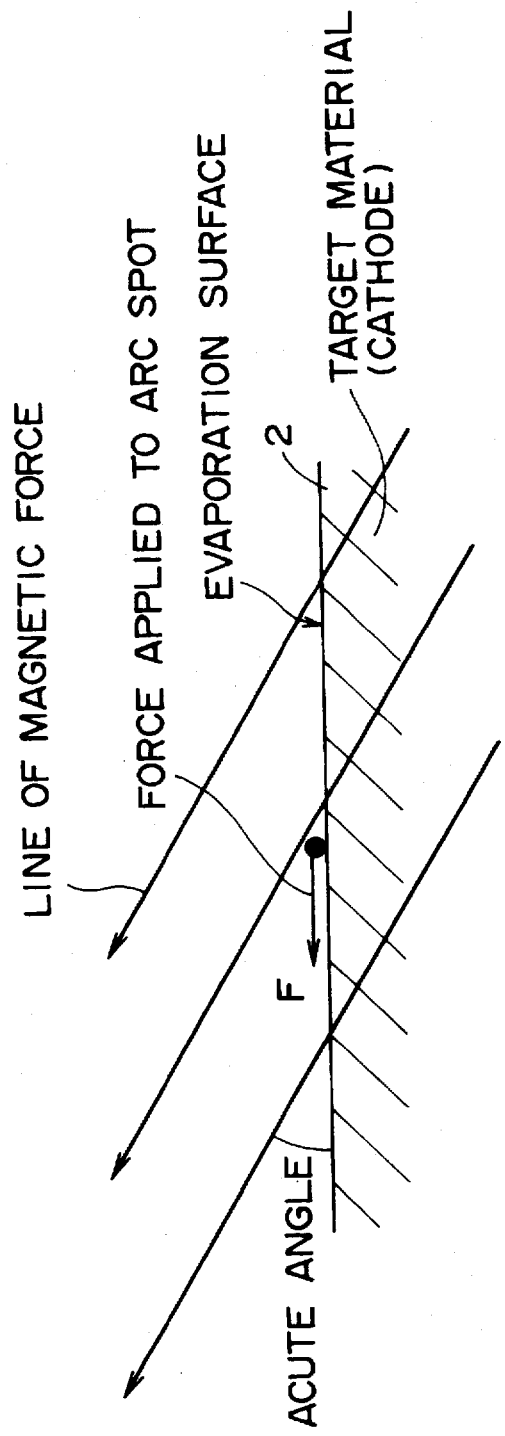
FIG. 9 is a schematic view for explaining the function of the present invention.

FIG. 7 shows a further modification of the first embodiment of the present invention. As is apparent from this figure, it is effective in terms of economy that at least part of the exciting current of each of the exciting coils 8 at both the ends is supplied from the arc discharge current itself by a power source 11 for common use in the arc power source and the coil power source.

The present invention is not limited to the above embodiment and the modifications. For example, the magnetic field forming means is not limited to the exciting coil, but may include the other devices of forming a magnetic field diverged outwardly from the center line in the direction from the end portion to the center of the evaporation source. Moreover, the magnetic field forming means may be provided in the vacuum vessel, and only at one end portion of the evaporation source. Additionally, a pole piece made of a magnetic body for effectively introducing the magnetic field formed by the exciting coil to the end portion of the evaporation source may be provided at the portion ranging from the interior of the coil to the vicinity of the end portion of the evaporation source.

[Embodiment 2]

Figure 10:
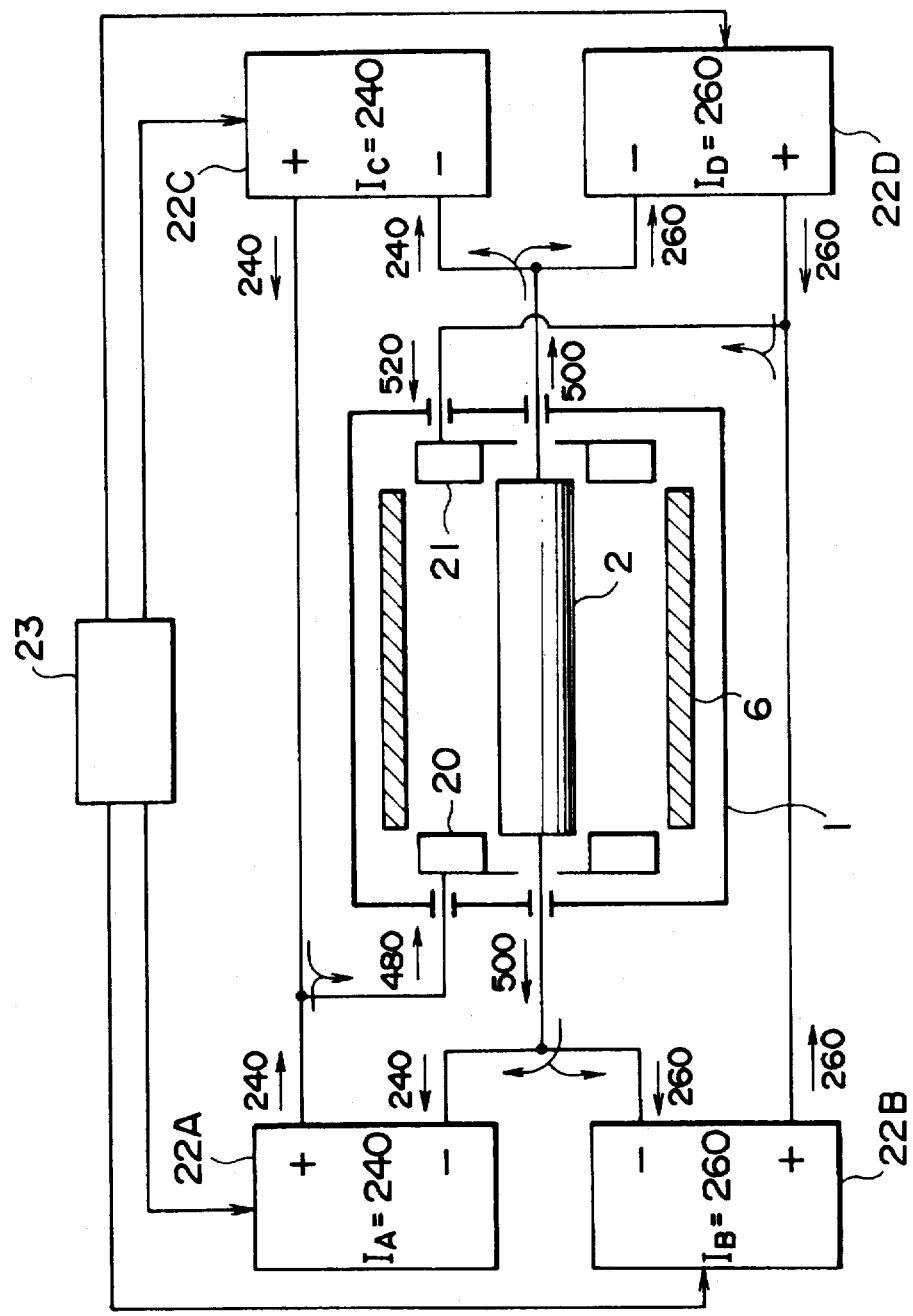
FIG. 10 is a schematic view showing the construction of a second embodiment of the present invention.

FIG. 10 shows a vacuum arc deposition apparatus of a second embodiment of the present invention, wherein a cylindrical evaporation source 2 is disposed in a vacuum vessel 1. A right anode electrode 21 and a left anode electrode 20 are respectively disposed near the right and left ends of the evaporation source 2 in such a manner as to cover the evaporation source 2 ("the right and left" means the right and left on the paper surface of FIG. 10). Each of the right and left electrodes 21 and 20 is formed in a continuous ring shape, but is not limited thereto. Moreover, the right and left electrodes 21 and 20 are separated from each other in this embodiment, but may be connected to each other.

Cathodes of arc power sources 22 are connected to the right and left end portions of the evaporation source 2. The arc power sources 22 are composed of first to fourth power source 22A, 22B, 22C, and 22D. The cathodes of the first and second arc power sources 22A and 22B are connected to the left end portion of the evaporation source 2; while the cathodes of the third and fourth arc power sources 22C and 22D are connected to the right end portion of the evaporation source 2. These cathodes are insulated from the vacuum vessel 1.

The left electrode 20 is connected to the anodes of the first and third arc power sources 22A and 22C, while the right anode electrode 21 is connected to the anodes of the second and fourth arc power sources 22B and 22D. These anodes are insulated from the vacuum vessel 1.

The current outputs from the arc power sources 22A to 22D can be independently controlled by a controller 23.

In this embodiment, the arc power source apparatus of the present invention is constituted of the arc power sources 22A to 22D and the controller 23.

A substrate 6 as a workpiece is provided in the vacuum vessel 1.

In addition, at least the outermost peripheral portion of the cylindrical portion of the evaporation source 2 is made of a material to be evaporated and to form a film on the substrate 6. The cylindrical body of the evaporation source 2 includes not only a hollow type but also a solid type. Moreover, the cross-section of the evaporation source 2 is not limited to a circular shape, but may include a polygonal shape.

In this embodiment, the output currents of the arc power sources 22A to 22D are each set by the controller 23 as follows:

current IA of the first arc power source 22A=240 A
current IB of the second arc power source 22B=260 A
current IC of the third arc power source 22C=240 A
current ID of the fourth arc power source 22D=260 A When the currents of the arc power sources 22A to 22D are set as described above, the cathode current of IA+IB= IC+ID=500 A uniformly flows at each of the right and left ends of the evaporation source 2. On the other hand, the anode current of IA+IC=480 A flows at the left anode electrode 20, while the anode current of IB+ID=520 A flows at the right anode electrode 21. Accordingly, the anode current balance can be changed while uniformly keeping the cathode current balance.

By suitably setting the currents of the arc power sources IA to ID using the controller 23 in the same manner as described above, it becomes to change only the cathode current balance and to change the balances of the cathode current and the anode current.

The controllability in the scanning of arc spots can be significantly improved by the change in the anode current balance.

As a result, when the localization of arc spots is checked visually or using mechanism of monitoring the behavior of arc spots, the positions of the arc spots can be corrected by individually changing the output currents of the arc power sources manually or automatically.

Figure 11:
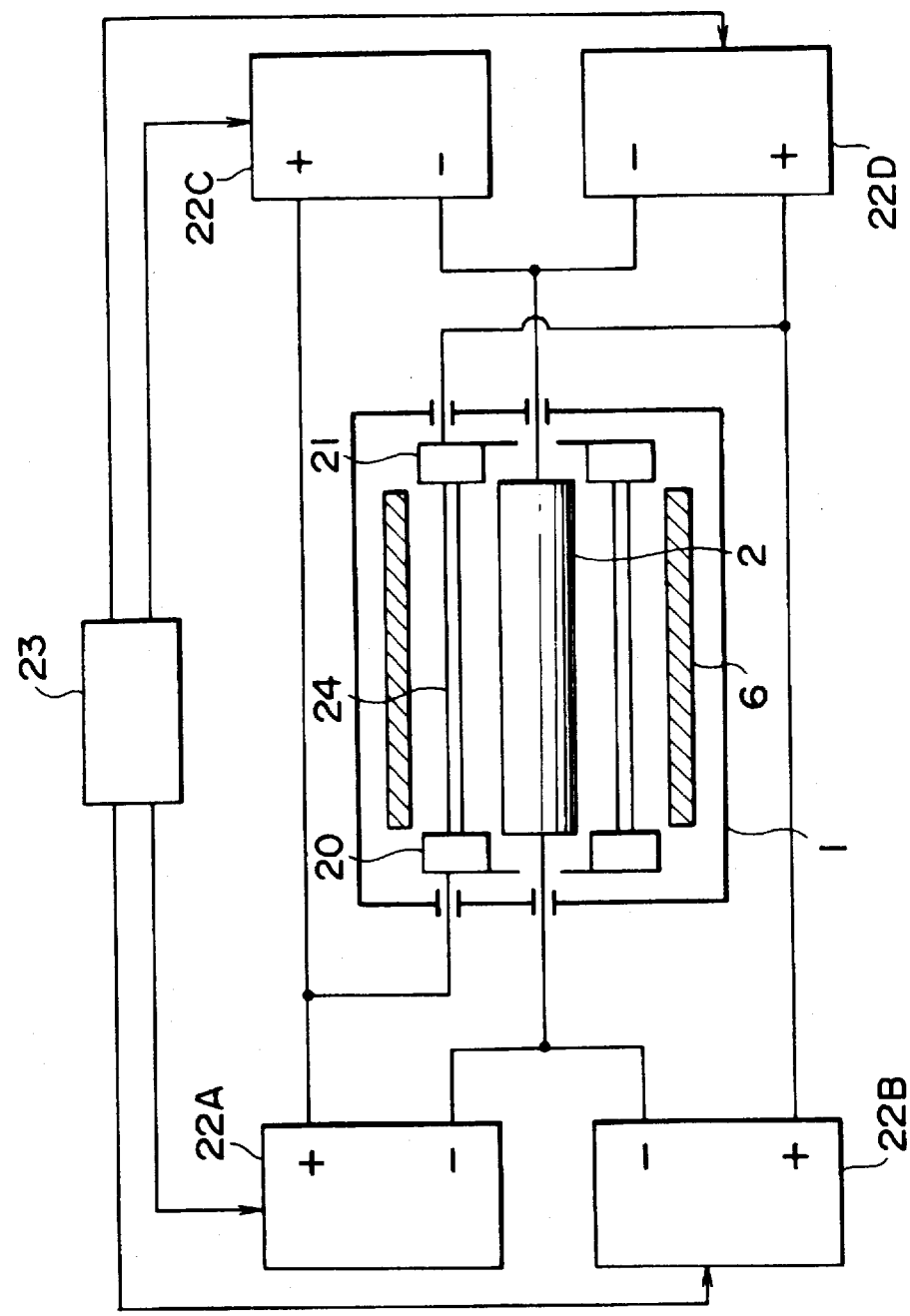
FIG. 11 is a schematic view showing the construction view of a modification of the second embodiment of the present invention.

FIG. 11 shows a modification of the second embodiment of the present invention, which is modified from this embodiment in that the right and left ring-like anode electrodes 21 and 20 are electrically connected to each other by means of a plurality of bar-like bodies 24. The bar-like body 24 may be formed of a copper pipe, the interior of which is cooled with water. In this modification, the bar-like bodies 24 are disposed at positions quarter-divided along the circumferential direction of each of the ring-like anode electrodes 21 and 20.

Figure 12:
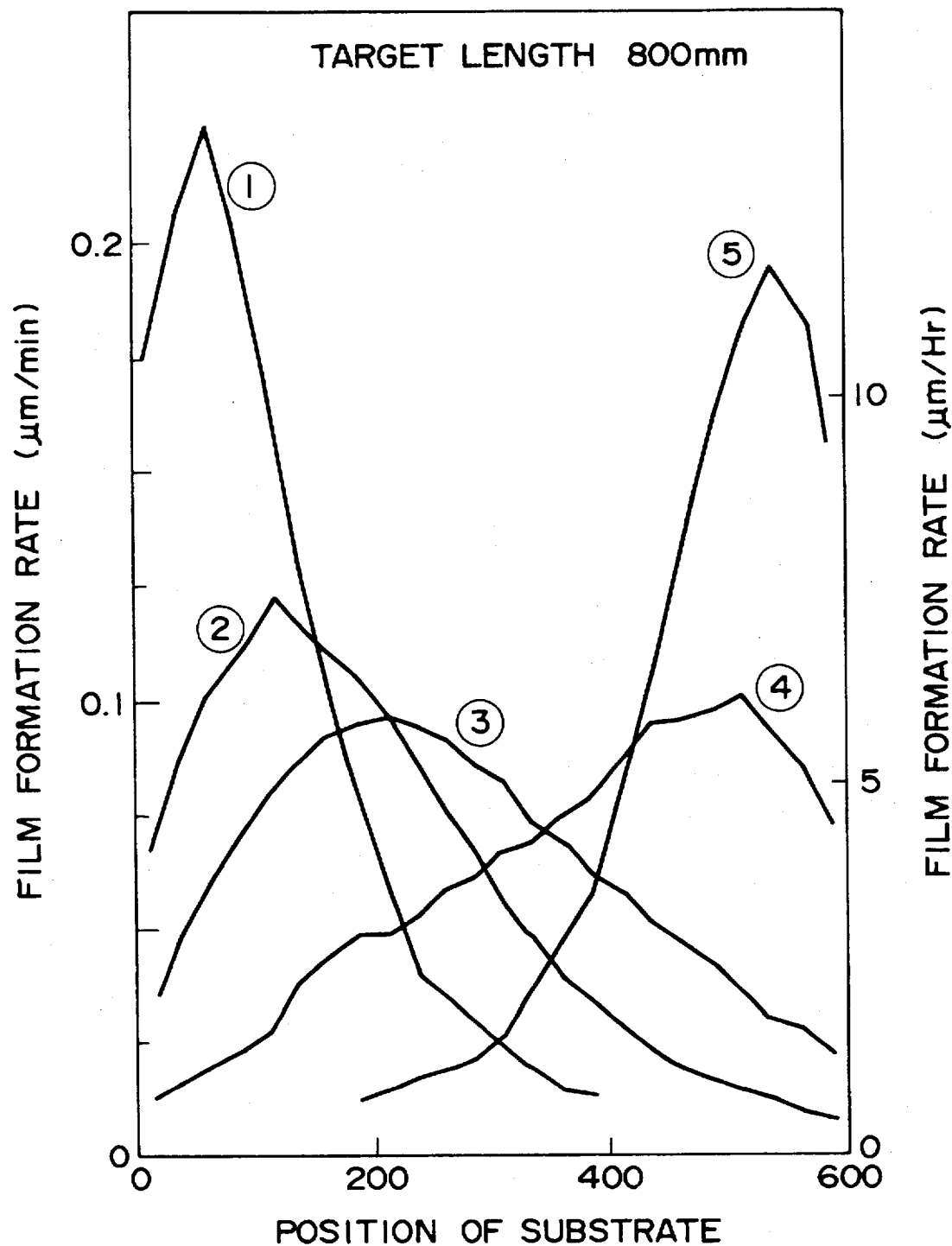
FIG. 12 is a graph showing the relationship between the arc current balance and the film formation rate in the film formation of a $Cr_2N$.

With this construction shown in FIG. 11, the film was formed on the substrate 6 by the steps of applying a bias voltage of 25 V to the substrate 6; keeping the interior of the vacuum vessel 1 at 2 mTorr with nitrogen gas; and allowing the cathode current of 500 A to uniformly flow to each of the right and left ends of the evaporation source 2 such that the total of the output currents of four arc power sources 22A to 22D, that is, the discharge current is set at 1000 A, while controlling the anode current balance by the controller 23. The film formation rate is shown in FIG. 12.

The arc current balances (unit: A) in the curves of ① to ⑤ in FIG. 12 are shown in the Table 1.

TABLE 1

| No. | IB, ID | IA, IC |
|---|---|---|
| ① | 290 | 210 |
| ② | 260 | 240 |
| ③ | 250 | 250 |
| ④ | 240 | 260 |
| ⑤ | 210 | 290 |

FIG. 12 shows the thickness of the film formed on the substrate 6 per unit time along the axial direction of the substrate. The film thickness distribution obtained by continuing the film formation using the arc currents shown in Table 1 is oportional to that shown in FIG. 2 along the vertical axis.

When each arc current is changed, the total thickness of films is obtained by the addition of the thickness of each film formed using each arc current.

As is apparent from FIG. 12, in the case of a large current discharge, the film thickness distribution can be accurately controlled by controlling the anode current balance. Moreover, the desirable film thickness distribution can be obtained by a method of changing the output current of each of the arc power sources 22A to 22D for controlling the scanning arc spots, and combining the arc current balances of ① to ⑤.

Figure 13:
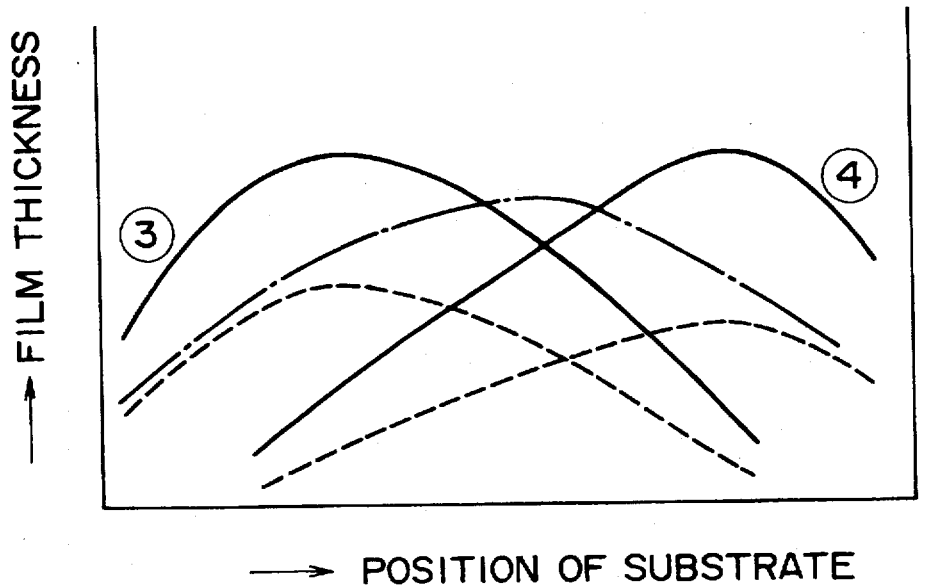
FIG. 13 is a graph for explaining the function of the second embodiment of the present invention.

Namely, in FIG. 13, the curve of the solid line shows the film thickness distribution obtained by the film formation for each 100 min using each current of ③ and ④; the curve of the dotted line shows the distribution obtained by the film formation for 60 min using the current of ③ or for 40 min using the current of ④; and the distribution of the two-dotted line shows the film thickness distribution obtained by the film formation for 60 min using the current of ③ and for 40 min using the current of ④.

Figure 14:
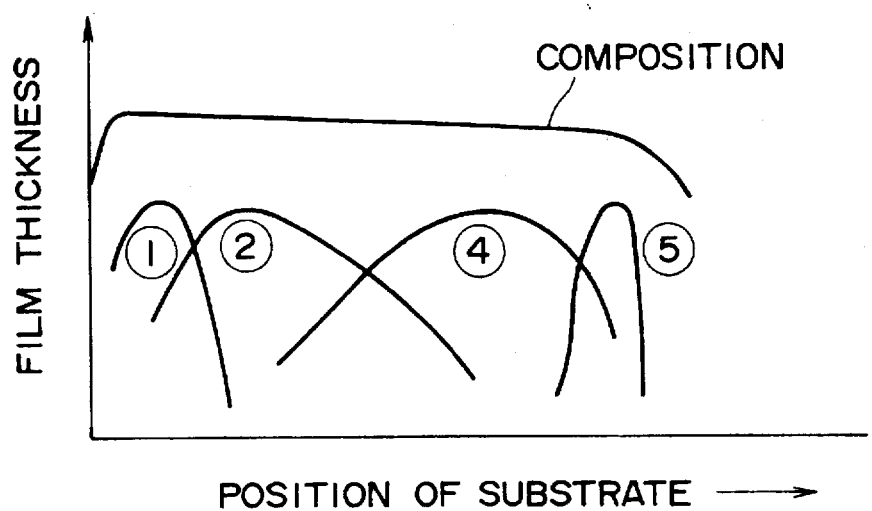
FIG. 14 is a graph for explaining the function of the second embodiment of the present invention.

FIG. 14 shows the film thickness distribution obtained by the film formation using the combined currents ①, ②, ④, and ⑤.

Figure 15:
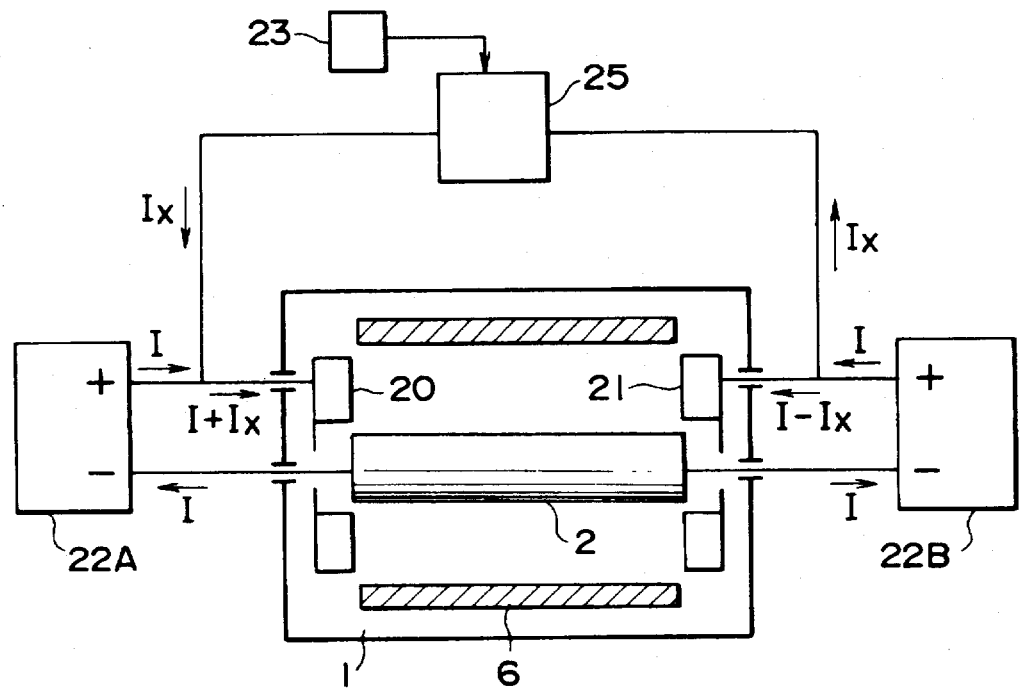
FIG. 15 is a schematic view showing another modification of the second embodiment of the present invention.

FIG. 15 shows another modification of the second embodiment of the present invention, wherein a pair of right and left arc power sources 22 are provided. In the left arc power source 22A, a cathode is connected to the left end portion of the evaporation source 2 and an anode is connected to the left anode electrode 20. In the right arc power source 22B, a cathode is connected to the right end portion of the evaporation source 2 and an anode is connected to the right anode electrode 21.

A control power source 25 for controlling the anode current balance is added. In the control power source 25, a cathode is connected to the right anode electrode 21 and an anode is connected to the left anode electrode 20. The polarity and the magnitude of the control current of the control power source 25 can be controlled by the controller 23.

In this modification, the arc power source apparatus of the present invention is constituted of the arc power sources 22A and 22B, control power source 25 and controller 23.

When equal discharge currents I are supplied from the right and left arc power sources 22A and 22B, and a control current Ix is supplied to the left anode electrode 20 from the control power source 25, the current (I+Ix) flows at the left anode electrode 20, and the current (I−Ix) flows at the right anode electrode 21. Accordingly, the anode current balance can be changed by changing the polarity and the magnitude of the current Ix by means of the controller 23.

Figure 16:
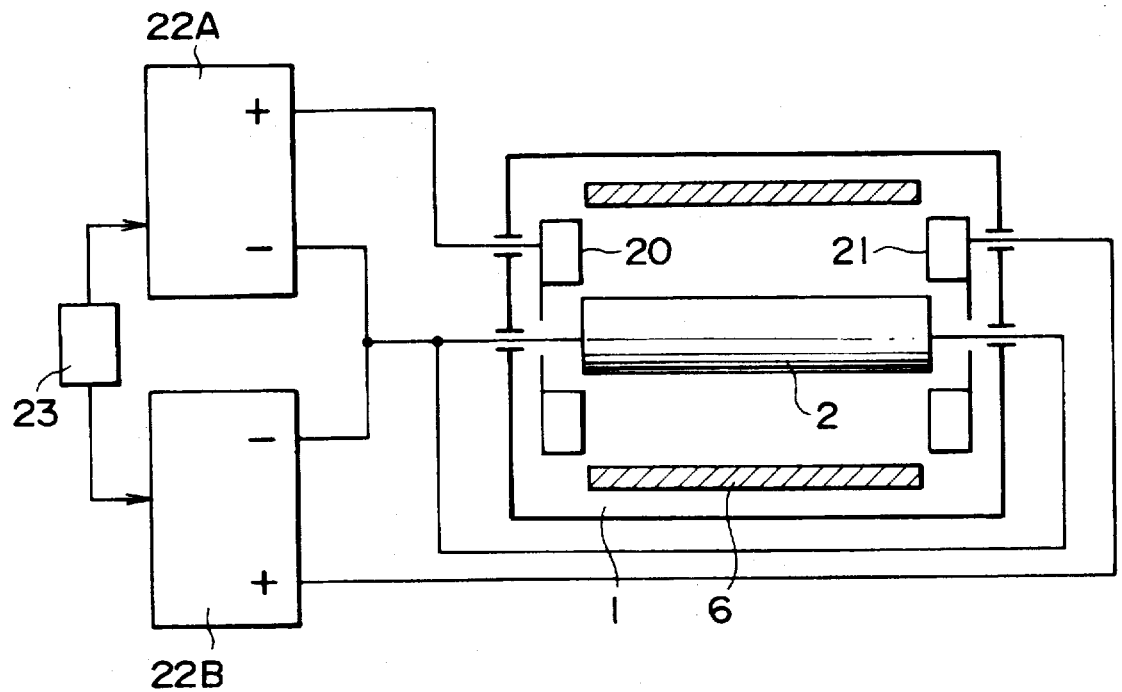
FIG. 16 is a schematic view showing a further modification of the second embodiment of the present invention.

FIG. 16 shows a further modification of the second embodiment of the present invention, wherein the cathodes of a first arc power source 22A and a second arc power source 22B are collectively connected to the right and left end portions of the evaporation source 2, and the anode of the first arc power source 22A is connected to the left anode electrode 20 while the anode of the second arc power source 22B is connected to the right anode electrode 21.

In this modification, the different in the output currents of the arc power sources 22A and 22B leads to the difference in the anode currents, thus changing the anode current balance.

Figure 17:
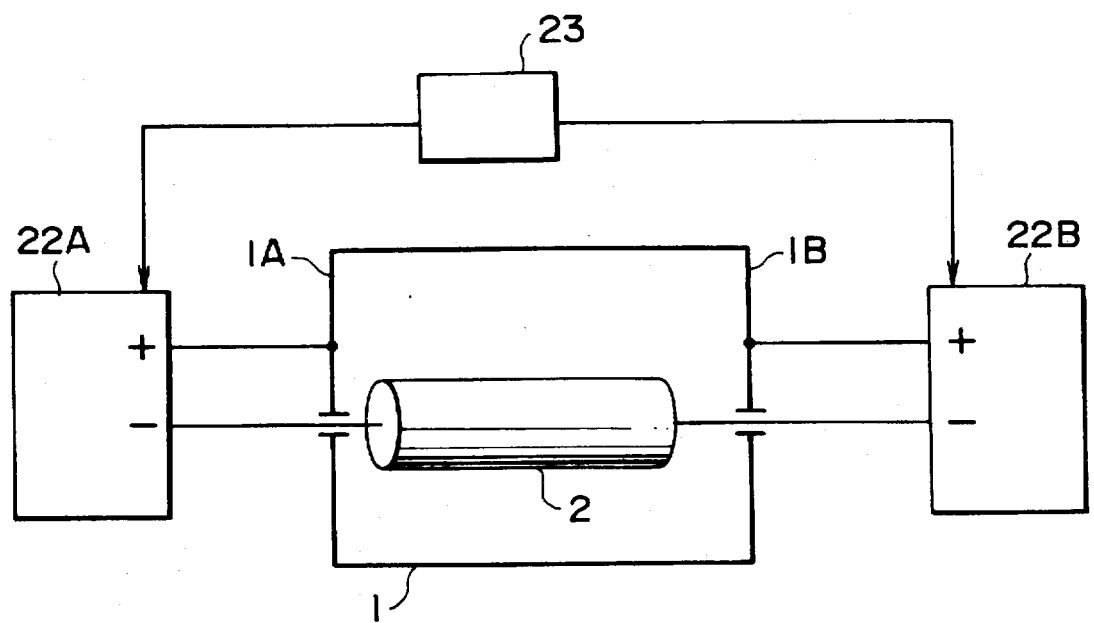
FIG. 17 is a schematic view showing a still further modification of the second embodiment of the present invention.

FIG. 17 shows a still further modification of the second embodiment of the present invention, wherein a left wall 1A of a vacuum vessel 1 is connected to an anode of a first arc power source 22A, and a right wall 1B of the vacuum vessel 1 is connected to an anode of a second arc power source 22B, so that the right and left walls 1A and 1B are taken as the anode electrodes near both the ends of the evaporation source 2.

[Embodiment 3]

Figure 19:
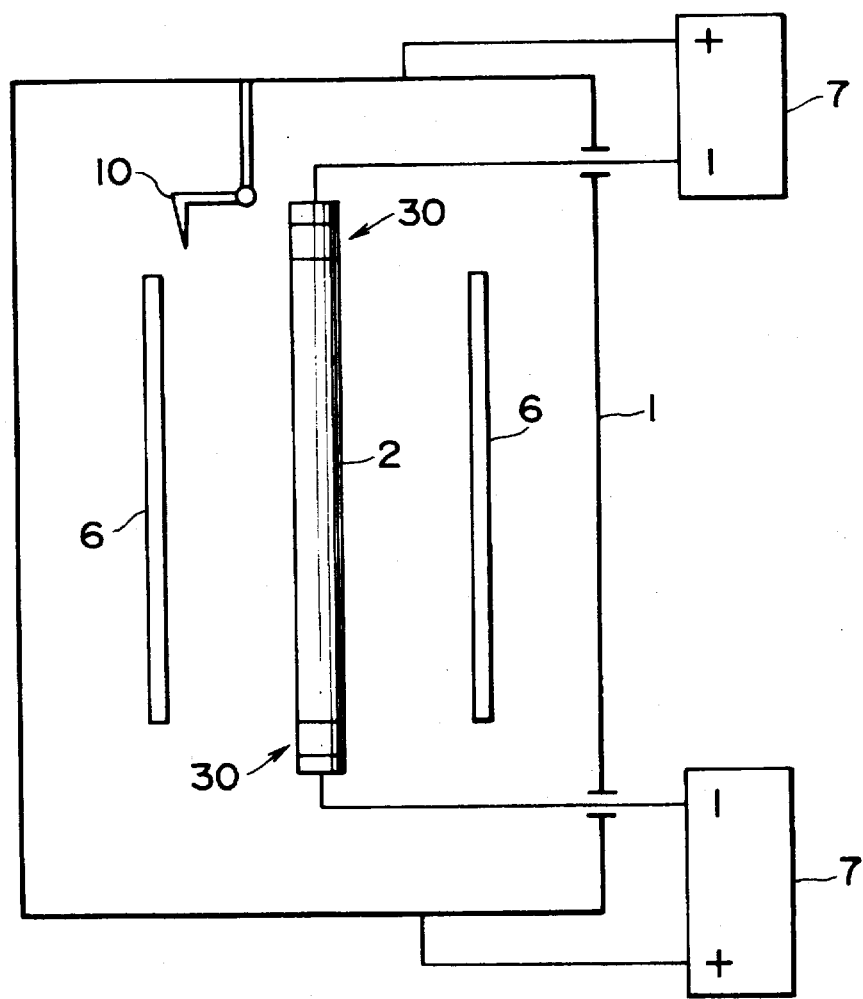
FIG. 19 is a schematic view showing a vacuum arc deposition apparatus of the third embodiment.

FIG. 19 shows the whole construction of a vacuum arc deposition apparatus of a third embodiment of the present invention, which is the same as that shown in FIG. 1, except for the structures of the holder, arc containment ring and insulator. In FIG. 19, to uniformly evaporate a target material from the surface of the evaporation source 2, arc containment devices 30 are provided at both the end portions of the evaporation source 2 for preventing the escape of arc spots from the surface of the specified evaporating surface of the evaporation source 2.

Figure 18:
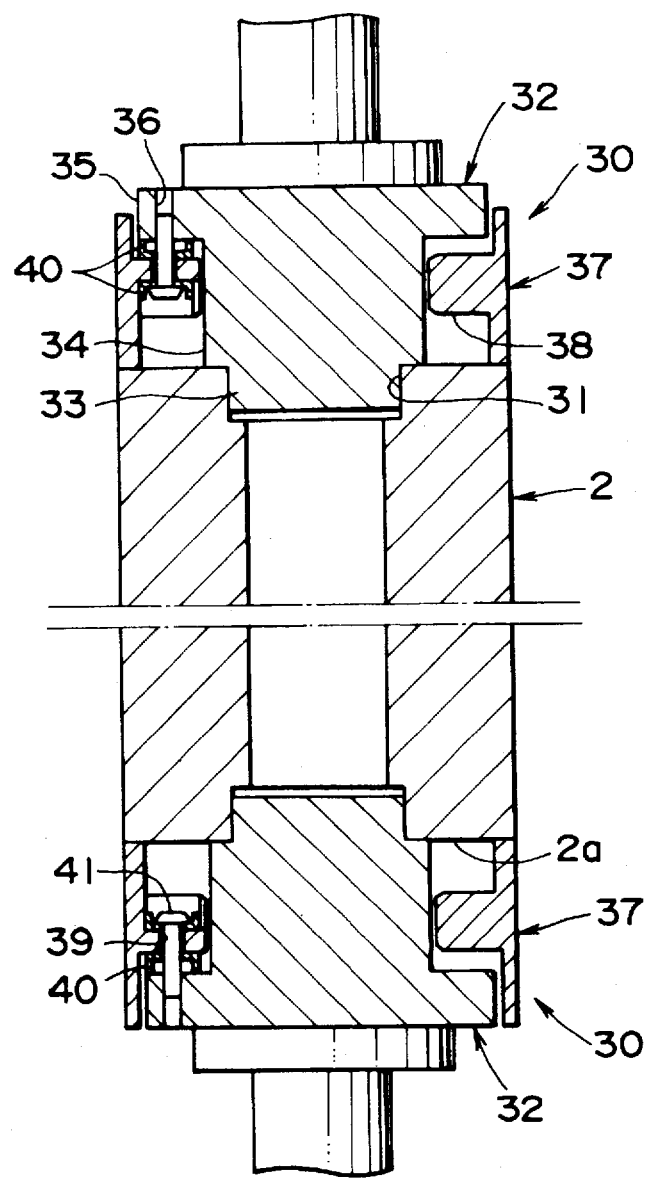
FIG. 18 is a sectional view showing a third embodiment of the present invention.

FIG. 18 shows the detail of the above arc containment device 30.

In FIG. 18, the evaporation source 2 is formed in a cylindrical hollow shape, with stepped holes 31 formed at both the longitudinal ends thereof. An electrode 32 is fitted in the stepped hole 31, and is electrically connected to the evaporation source 2. The electrode 32 is connected to a cathode of an arc power source 7.

The electrode 32 has a small diameter portion 33 fitted in the stepped hole 31, an intermediate diameter portion 34 larger in diameter than the small diameter portion 33 and outwardly projecting from the end surface 2a of the evaporation source 2, and a flange portion 35 larger in diameter than the intermediate portion 34. The outside diameter of the flange portion 35 is smaller than that of the evaporation source 2. Screw holes 36, each having the axis parallel to that of the electrode 32, are provided in the flange portion 35 in such a manner as to be spaced at specified intervals in the circumferential direction.

An arc containment body 37 is provided in such a manner as to project axially outwardly from each end surface 2a of the evaporation source 2, and to cover the outer peripheries of the electrode 32.

The arc containment body 37 is formed of metal, preferably, magnetic material in the shape of a short cylindrical ring. The outside diameter of the arc containment body 37 is the same as that of the evaporation source 2. The arc containment body 37 is disposed so as to be coaxial with the evaporation source 2.

A mounting portion 38 radially inwardly projects from the inner surface in the axial midway of the arc containment body 37 such that the inner peripheral surface of the mounting portion 37 faces to the outer peripheral surface of the intermediate portion 34 of the electrode 32 by way of a gap. Mounting holes 29 are provided in this mounting portion 38 at the same pitch as that of the screw holes 36. A screw 41 is inserted in each mounting hole 38 by way of an insulator 40, and is screwed with the screw hole 36, and thereby the arc containment body 37 is fixed on the electrode 32 while keeping the electric insulation.

The end surface of the arc containment body 37 faces to the end surface of the evaporation source 2 with a slight gap of 0.2 to 2 mm; accordingly, the arc containment body 37 can be electrically insulated.

In the arc containment device 30 having the above-described construction, since the arc containment body 37 is disposed at each end portion of the evaporation source 2 in the electrically insulated state, arc spots scanning along the outer peripheral surface of the evaporation source 2 are prevented from being moved from the outer peripheral surface to the end surface 2a. Consequently, the arc spots are shifted again to the specified evaporating surface of the outer peripheral surface of the evaporation source 2, thereby stabilizing the arc.

Moreover, since the arc containment body 37 is disposed so as to be coaxial with the evaporation source 2 and it has the same outside diameter as that of the evaporation source 2, it becomes possible to suppress the vapor of the target material generated from the outer peripheral surface of the evaporation source 2 from being deposited on the arc containment body 37.

In general, as for the evaporation of the material from arc spots, the number of the evaporated particles in parallel to the evaporating surface is extremely small. Accordingly, in the present invention in which the arc containment body 37 does not project from the evaporating surface, the deposition onto the arc containment body 37 can be suppressed.

Since the arc containment body 37 is disposed so as to be separated from the electrode 32 and the evaporation source 2 by way of the specified gap, even if there is a difference in thermal expansion therebetween, the arc containment body 36 can be prevented from being damaged due to the thermal deformation.

The arc containment body 37 formed of not a thin sheet laminated structure but a one-piece does not generate the thermal strain, so that it can be prevented from being short-circuited due to the thermal deformation, thus achieving the stable arc containment function for a long period.

The evaporation source 2 is not limited in the configuration to the straight cylinder, but may be curving cylinder; and it may be formed in a solid body. Moreover, it is not limited in the sectional shape to the circle. In addition, the evaporation body 2 is not limited in the disposition to the vertical posture but may be provided in the horizontal posture.

Figure 20:
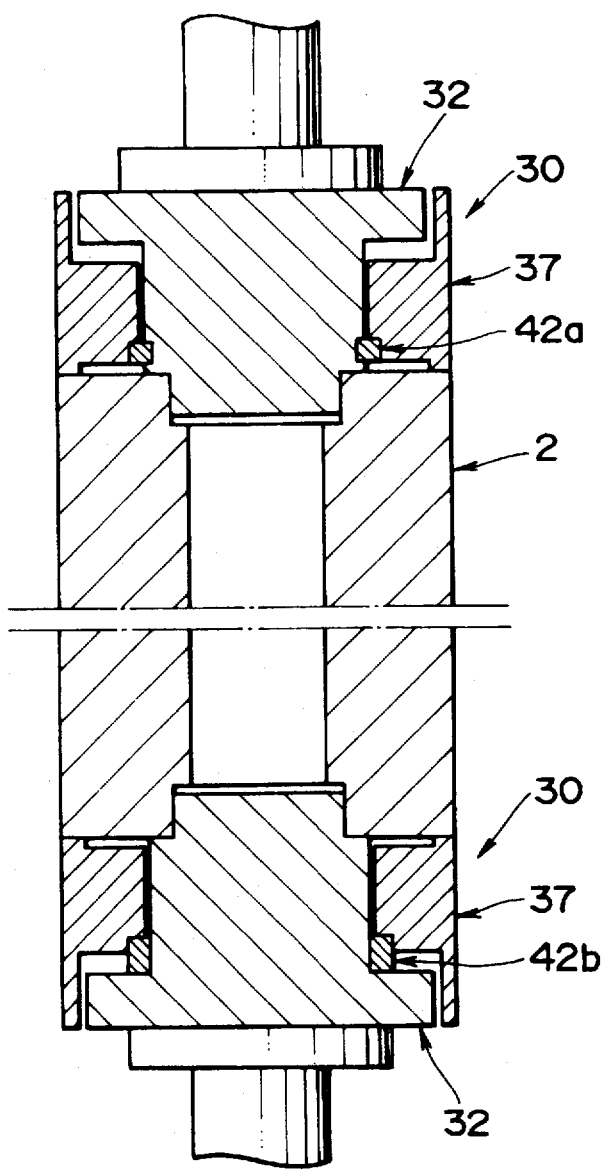
FIG. 20 is a sectional view showing a modification of the third embodiment of the present invention.

FIG. 20 shows a modification of the third embodiment of the present invention, which includes each arc containment body 37 provided around the electrode 32 by way of an insulator 42. In this modification, the evaporation source 2 is disposed in the vertical posture as shown in FIG. 20, and the arc containment body 37 is placed on the insulator 42 and is not fixed on the electrode 42. The arc containment body 37 is electrically insulated from the evaporation source 2 and the electrode 32.

In the modification shown in FIG. 20, the mounting hole 39 shown in FIG. 18 is not provided, so that the localization of arc spots can be eliminated.

Specifically, in the case of using a specified material such as Cr, in the apparatus shown in FIG. 18, there has arisen a problem in generating the local consumption of the evaporation source 2 because of the localization of arc spots on the surface of the evaporation source 2 near the mounting holes 39. On the contrary, in the apparatus shown in FIG. 20, since the cross-section of the arc containment body 37 is uniform and isotropic, it becomes possible to suppress the localization of arc spots at the defect portions such as the screw holes 36, and hence to stabilize the evaporation for a long period.

In particular, where a magnetic field is applied at each end portion of the evaporation source 2 by the additional means for arc control, by use of the arc containment body 37 having a uniform cross-section, it becomes possible to prevent the local disturbance of the magnetic field at the end portion of the evaporation source 2, and hence to ensure the stable scanning characteristic of arc spots.

Figure 21:
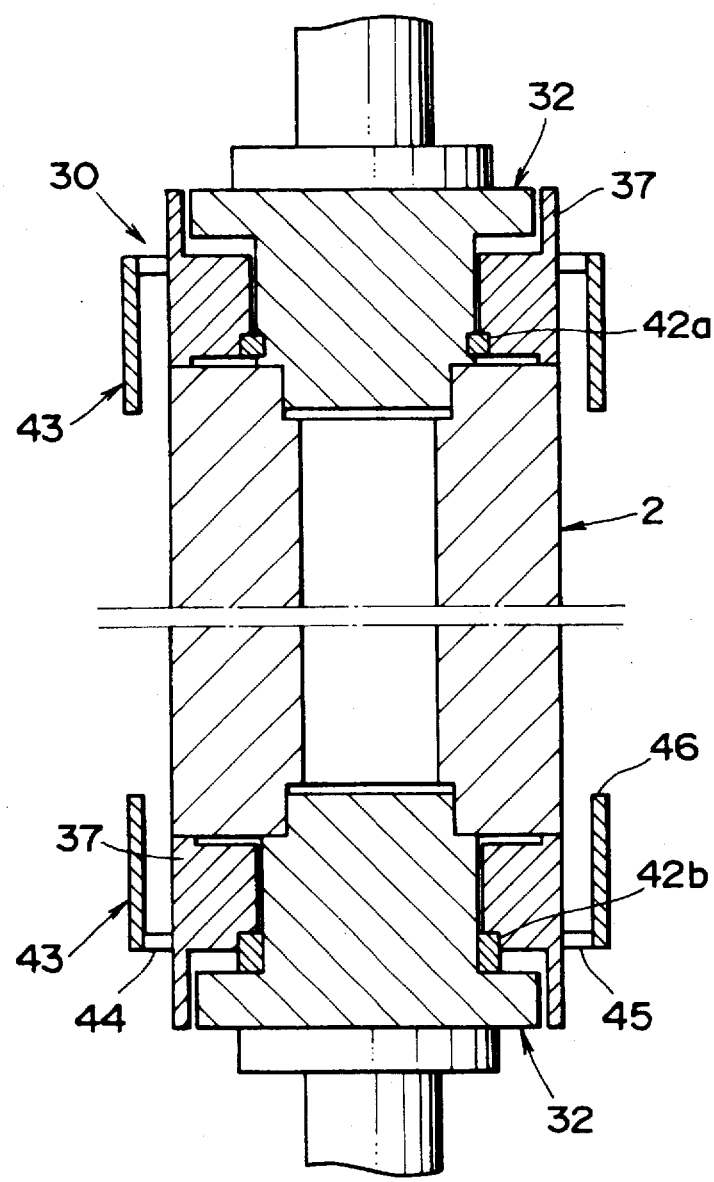
FIG. 21 is a sectional view showing another modification of the third embodiment of the present invention.

FIG. 21 is another modification of the third embodiment of the present invention, wherein a cover 43 is provided for covering the boundary between the evaporation body 2 and the arc containment body 37 in addition to the construction shown in FIG. 20.

Namely, the cover 43 is formed in a ring-shape and is mounted around the arc containment body 37 by way of a supporting portion 44. The cover 43 is radially spaced from the evaporation source 2 at a specified gap, and is thus electrically insulated therefrom. The supporting portion 44 is not necessarily required to be formed of a one-piece annular member, and may be composed of two or three pieces of discharge portions 45 which are preferably spaced from each other at specified intervals in the circumferential direction. The discharge portions 45 allows foreign matters such as dust to be dropped therethrough.

By provision such a cover 43, it becomes possible to prevent the arc spot from entering the space between the evaporation source 2 and the arc containment body 37.

Figure 22:
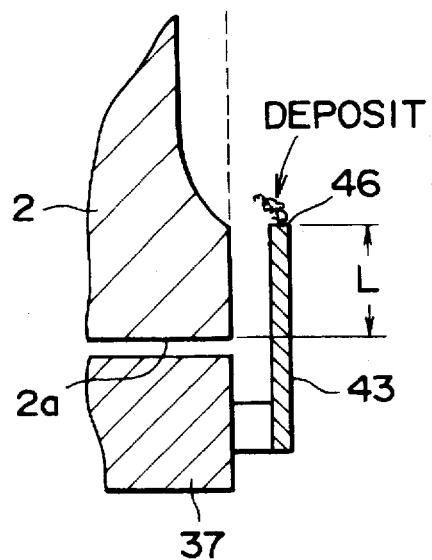
FIG. 22 is a sectional view showing the state that the evaporation source is consumed.

As shown in FIG. 22, when the cover 43 covers the end portion of the evaporation source 2 by a distance L, the arc spot does not reach the end portion of the evaporation source 2, so that the evaporation source 2 is started to be consumed from the position separated from the end portion 2a by the distance L. Accordingly, even when the evaporation source 2 is consumed, there is not generated any stepped portion between the evaporation source 2 and the arc containment body 37, thereby preventing the short-circuit between the evaporation source 2 and the arc containment body 37. In addition, even when a film is deposited on an end surface 46 of the cover 43, there is no trouble in the electric insulation, such as short-circuit, because the diameter of the evaporation source 2 at the position corresponding to the deposited position is reduced.

The arc spot does not reach the end portion of the evaporation source 2 by provision of such a cover 43, so that the possibility that the arc spot is deviated from the evaporating surface is made extremely lowered. There is an limitation in suppressing the runaway of the arc spot by the magnetic field. However, the behavior of the arc spot is stabilized by provision of the cover 43, and thereby the arc spot can be easily controlled over the whole evaporating surface.

In addition, by provision of the cover 43 on the apparatus shown in FIG. 18, it becomes possible to prevent the arc spot from being localized at failure portions such as the screw holes 36.

In this embodiment, each of the arc containment body 37 and the cover 43 is formed of a magnetic metal; however, it may be formed of an insulator such as ceramics.

In the case of forming the arc containment body 37 of an insulator, the end portion 2a of the evaporation source 2 can be closely contacted with the end surface of the arc containment body 37, so that the shift of the arc spot to the end surface of the evaporation source 2 can be perfectly prevented.

Figure 23:
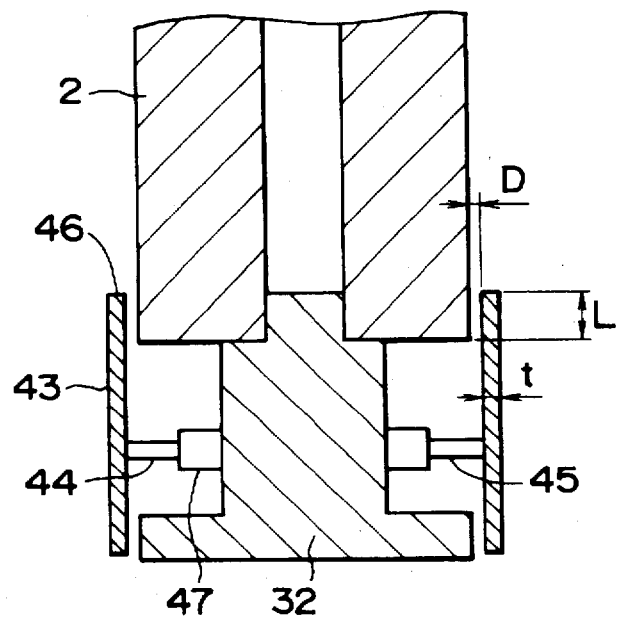
FIG. 23 is a sectional view showing a further modification of the third embodiment of the present invention.

FIG. 23 shows a further modification of the third embodiment, wherein the arc containment body 37 is not provided, and instead a cover 43 is provided in an electric insulating manner at the end portion of the bar-like evaporation source 2 for covering the outer peripheral surface of the end portion of the evaporation source 2 with a specified gap being put therebetween.

Specifically, the cover 43 is formed of a ring-shape, and is mounted around the outer peripheral surface of an electrode 32 by way of an insulator 47 and a supporting portion 44. The cover 43 is radially spaced from the evaporation source 2 at a gap D, and is axially overlapped on the evaporation source 2 by a distance L.

The gap D must be set at a value enough to prevent the short-circuit between the evaporation source 2 and the cover 43 by the deposited dust, and must be 1 mm or more. However, when the gap D is excessively larger, the overlapping distance L between the evaporation source 2 and the cover 43 is made larger depending on the relationship between the gap D and the distance L described later, which is inconvenient in terms of economy. The gap D is preferably specified to be less than 10 mm. As an experimental result, to obtain the most stable operation, the gap D is desired to be in the range of from 2 to 5 mm.

The axial overlapping distance L between the evaporation source 2 and the cover 43 is experimentally required to satisfy the equation $L \geq D$. When L is smaller than D, the arc spot accidentally entering the inside of the cover 43 reaches the end portion of the evaporation source 2, which leads to the generation of the uneven wear near the end portion of the evaporation source 2. On the other hand, when L is excessively larger, the non-consumed region of the evaporation source 2 is made larger, which is inconvenient in terms of economy. As the value of L becomes larger, the operation becomes more stable; however, even when L becomes larger than 3D, the effect of stabilizing the operation is saturated. Accordingly, the upper limit of the distance L is preferably set at 3D. As the experimental result, the distance L is more preferably in the range of $D<L<2D$.

As for the thickness (t) of the cover 43, when it is smaller than 0.5 mm, the thermal deformation tends to be generated; while when it is excessively larger, the deposited amount on the end surface 46 of the cover 43 is increased, and the film thus formed is possibly peeled and acts as dust, which leads to the short-circuit between the evaporation source 2 and the cover 43. In this regard, the thickness (t) is required to be 6 mm or less, preferably, in the range of from 1 to 3 mm.

In addition, each discharge portion 45 for discharging dust is desired to be formed in the supporting portion 44.

Figure 24:
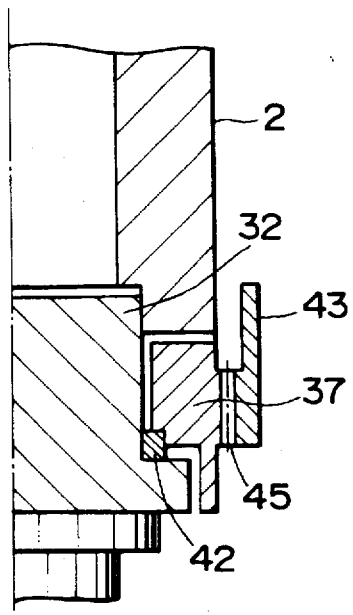
FIG. 24 is a sectional view showing a further modification of the third embodiment of the present invention.

FIG. 24 shows a further modification of the third embodiment, wherein an arc containment body 37 is molded integrally with a cover 43. The integrated molded body is mounted on an electrode 32 by way of an insulator 42. To prevent the deposition of dust, discharge portions 45 acting as foreign matter discharging holes are provided in the cover 43 in such a manner that they vertically pass through the cover 43 and are spaced from each other at specified intervals.

Figure 25:
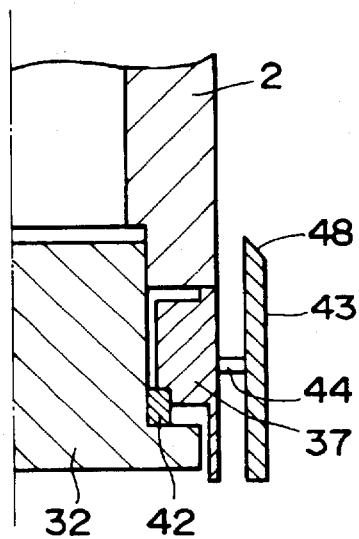
FIG. 25 is a sectional view showing a further modification of the third embodiment of the present invention.

FIG. 25 shows a further modification of the third embodiment, wherein the outer surface of the side end portion of a cover 43 is formed into a tapering-down surface 48. With this cover 43 in which the end surface is formed into the tapering-down surface 48, it becomes possible to lower the deposition on the end surface, and to reduce the frequency of maintenance.

In addition, the present invention is not limited to this embodiment and the modifications.

For example, the evaporation source 2 is not limited in shape to the straight cylinder and may be formed in a curving cylinder, and it may be formed in a solid body. Moreover, it is not limited in sectional shape to the circle.

As for the disposition of the evaporation source 2, the axis thereof is not limited to the vertical posture, and may be located in other postures such as a horizontal posture.

In this embodiment, the arc containment body 37 and the cover 43 are mounted on the electrode 32; however, they may be mounted on the other member, for example, they may be mounted in an insulating manner on a stepped portion formed at the end portion of the evaporation source 2.

Although the electrode 32 is mounted at each end of the evaporation source 2 in this embodiment, it may be provided only at one end portion of the evaporation source 2. In this case, on the side of the evaporation source 2 where the electrode is not provided, the arc containment or cover may be mounted on the end portion of the evaporation source 2 directly or using a suitable supporting means in an electric insulating manner.

The relationship among L, D and t is not limited to that shown in FIG. 23, and it may be applied to the covers 43 shown in the other figures. In addition, the construction shown in each figure may be replaced by that shown in the other figure, and those shown in the figures may be suitably combined.

The arc containment device 30 of the present invention not limited to be used in the vacuum arc deposition apparatus having the construction shown in FIG. 19, and may be applied to other types of vacuum arc deposition apparatuses.

What is claimed is:

1. A vacuum arc deposition apparatus comprising:

a cylindrical evaporation source having a cylindrical axis;

a substrate positioned around said evaporation source so as to at least partially axially overlap the evaporation source;

a cathode of an arc power source connected to at least one end of said evaporation source so at to supply power to said evaporation source to form an arc for consuming the evaporation source and forming a film on said substrate; and a magnetic field forming exciting coil having a coil axis which is coaxial with the cylindrical axis of the evaporation source, said exciting coil being positioned offset with respect to an end of said evaporation source such that said exciting coil does not substantially overlap said evaporation source.

2. A vacuum arc deposition apparatus according to claim 1, including a coil power source provided for supplying an exciting current to said exciting coil and capable of controlling the exciting current in such a manner that the film thickness and the consumption of said evaporation source are distributed in a predetermined manner.

3. A vacuum arc deposition apparatus according to claim 1, wherein said magnetic field forming coil is axially movable.

4. A vacuum arc deposition apparatus according to claim 1, wherein a plurality of said magnetic field forming coils are provided, each of which is capable of controlling the intensity of the formed magnetic field.

5. The vacuum arc deposition apparatus of claim 1 including said exciting coil being positioned offset with respect to both ends of said evaporation source, further including cathodes of arc power sources connected to both ends of said evaporation source, and further including coil power sources independently connected to said exciting coils for controlling an exciting current to said coils so as to distribute a thickness of the film and the consumption of said evaporation source in a predetermined manner.

6. A vacuum arc deposition apparatus comprising:

a vacuum chamber;

a cylindrical evaporation source in said vacuum chamber;

a substrate positioned around said evaporation source so as to at least partially axially overlap the evaporation source;

an arc power source connected to at least one end of said evaporation source so at to supply power to said evaporation source to form an arc for consuming the evaporation source as a cathode and forming a film on said substrate; and anode electrodes disposed adjacent both ends of said evaporation source and electrically insulated from said vacuum chamber, wherein said arc power source is connected to said anode electrodes and is capable of independently applying currents to said anode electrodes.

7. A vacuum arc deposition apparatus according to claim 6, wherein said arc power source shares said coil power source.

8. A vacuum arc deposition apparatus according to claim 6, wherein the cathodes of said arc power source are connected to both ends of said evaporation source, and said arc power source is capable of independently controlling the currents supplied to both ends of said evaporation source.

9. A vacuum arc deposition apparatus according to claim 6, wherein two of said arc power source are provided such that the cathodes are each connected to end portions of said evaporation source.

10. A vacuum arc deposition apparatus according to claim 9, wherein an anode of said arc power source is connected to said anode electrodes.

11. A vacuum arc deposition apparatus according to claim 6, wherein two of said arc power source are provided such that the cathodes are connected to each end portion of said evaporation source.

12. A vacuum arc deposition apparatus according to claim 11, wherein an anode of said arc power source is connected to said anode electrodes.

* * * * *